US012600829B2

(12) United States Patent
Terui et al.

(10) Patent No.: US 12,600,829 B2
(45) Date of Patent: Apr. 14, 2026

(54) SUBLIMABLE FILM FORMATION COMPOSITION AND METHOD FOR PRODUCING SUBSTRATE

(71) Applicant: CENTRAL GLASS COMPANY, LIMITED, Ube (JP)

(72) Inventors: Yoshiharu Terui, Ube (JP); Soichi Kumon, Ube (JP); Yuki Fukui, Ube (JP)

(73) Assignee: Central Glass Company, Limited, Ube (JP)

( * ) Notice: Subject to any disclaimer, the term of this patent is extended or adjusted under 35 U.S.C. 154(b) by 776 days.

(21) Appl. No.: 17/905,978

(22) PCT Filed: Mar. 10, 2021

(86) PCT No.: PCT/JP2021/009462
§ 371 (c)(1),
(2) Date: Sep. 9, 2022

(87) PCT Pub. No.: WO2021/187263
PCT Pub. Date: Sep. 23, 2021

(65) Prior Publication Data
US 2023/0151163 A1      May 18, 2023

(30) Foreign Application Priority Data
Mar. 17, 2020      (JP) ................................. 2020-046815

(51) Int. Cl.
| | |
|---|---|
| *C08J 5/18* | (2006.01) |
| *B01D 7/00* | (2006.01) |
| *C08J 3/09* | (2006.01) |
| *H10P 70/00* | (2026.01) |

(52) U.S. Cl.
CPC ...................................... *C08J 5/18* (2013.01); *B01D 7/00* (2013.01); *C08J 3/09* (2013.01); *H10P 70/20* (2026.01)

(58) Field of Classification Search
CPC ........... B01D 7/00; C23C 14/12; C23C 14/24; C23C 14/243; C23C 14/246; C23C 14/26; C23C 14/28; C23C 14/30; C23C 14/32; C23C 14/325
See application file for complete search history.

(56) References Cited

U.S. PATENT DOCUMENTS

| | | |
|---|---|---|
| 11,124,869 B2 | 9/2021 | Sasaki et al. |
| 11,851,745 B2 | 12/2023 | Sasaki et al. |
| 2019/0390320 A1 | 12/2019 | Sasaki et al. |
| 2020/0135503 A1 | 4/2020 | Sasaki |

(Continued)

FOREIGN PATENT DOCUMENTS

| | | |
|---|---|---|
| CN | 110800087 | 2/2020 |
| JP | 10-135180 | 5/1998 |
| JP | 2007-335815 | 12/2007 |

(Continued)

OTHER PUBLICATIONS

The extended European search report issued for European Patent Application No. 21771781.8, Feb. 29, 2024, 9 pages.

(Continued)

*Primary Examiner* — Zachary M Davis
(74) *Attorney, Agent, or Firm* — HSML, P.C.

(57) ABSTRACT

The sublimable film formation composition of the present invention includes a sublimable substance and a solvent in which a saturation solubility of the sublimable substance is more than 10% by mass.

11 Claims, 7 Drawing Sheets

(56) References Cited

U.S. PATENT DOCUMENTS

| | | |
|---|---|---|
| 2021/0324509 A1 | 10/2021 | Sasaki et al. |
| 2022/0157597 A1 | 5/2022 | Terui et al. |

FOREIGN PATENT DOCUMENTS

| | | |
|---|---|---|
| JP | 2012-243869 | 12/2012 |
| JP | 2013-042094 | 2/2013 |
| JP | 2020-004907 | 1/2020 |
| JP | 2020-010015 A | 1/2020 |
| WO | 2019/021664 | 1/2019 |
| WO | 2020/044885 A1 | 3/2020 |
| WO | 2020/189688 A1 | 9/2020 |

OTHER PUBLICATIONS

International Search Report of PCT/JP2021/009462, May 25, 2021, 2 pages.

1

SUBLIMABLE FILM FORMATION COMPOSITION AND METHOD FOR PRODUCING SUBSTRATE

TECHNICAL FIELD

The present invention relates to a sublimable film formation composition and a method for producing a substrate.

BACKGROUND ART

Various developments have been made regarding production processes for substrates on which an uneven structure is formed. As a technique of this kind, for example, the technique described in Patent Document 1 is known.

Patent Document 1 describes a substrate drying method for drying a substrate by removing a liquid on the substrate on which an uneven pattern is formed on a surface, the method being provided with a sublimable substance filling step of supplying a sublimable substance solution to the substrate to fill the solution in recessed portions of the pattern, a solvent drying step of drying the solvent in the solution and filling the inside of the recessed portions of the pattern with the sublimable substance in a solid state, and a sublimable substance removal step of removing the sublimable substance from the substrate by heating the substrate to a temperature higher than the sublimation temperature of the sublimable substance (claim 1 of Patent Document 1).

RELATED DOCUMENT

Patent Document

[Patent Document 1] Japanese Unexamined Patent Publication No. 2012-243869

SUMMARY OF THE INVENTION

Technical Problem

However, as a result of investigation by the present inventors, it was found that, in the solution of the sublimable substance described in Patent Document 1 described above, there is room for improvement in terms of the production stability of the substrate.

Solution to Problem

As a result of further investigation by the present inventors, it was found that even in a case where a solution including a sublimable substance and a solvent is used, there is a concern that a large number of pattern collapses may occur in the uneven structure on the substrate.

The present inventors carried out further intensive research based on such findings and found that, in a sublimable film formation composition including a sublimable substance and a solvent, by appropriately selecting a solvent in which the solubility of the sublimable substance is comparatively high and with a comparatively high volatility, or by appropriately combining two or more solvents, it is possible to suppress the occurrence of pattern collapse and to improve the production stability of the substrate, thereby completing the present invention.

According to the present invention, there is provided a sublimable film formation composition including
　a sublimable substance, and
　a solvent A1 in which a saturation solubility of the sublimable substance is more than 10% by mass and a boiling point is lower by 5° C. or more than a boiling point of the sublimable substance at 1 atm.

According to the present invention, there is provided a sublimable film formation composition including
　a sublimable substance,
　a solvent A2 in which a saturation solubility of the sublimable substance is more than 10% by mass, and
　a solvent B2 in which a content in the sublimable film formation composition is greater than a content of the solvent A2 and a boiling point is less than a boiling point of the sublimable substance at 1 atm and less than a boiling point of the solvent A2.

In addition, according to the present invention, there is provided a method for producing a substrate, the method including
　a step of preparing a substrate having an uneven structure on a surface,
　a step of supplying a sublimable film formation composition including a sublimable substance to the surface,
　a step of causing the sublimable film formation composition to coagulate and forming a sublimable film on the surface, and
　a step of removing the sublimable film by sublimating the sublimable substance,
　in which the sublimable film formation composition including the sublimable substance is the sublimable film formation composition described above.

Advantageous Effects of Invention

According to the present invention, there is provided a sublimable film formation composition with excellent substrate production stability and a method for producing a substrate.

DESCRIPTION OF EMBODIMENTS

A description will be given of the sublimable film formation composition of the present embodiment.

The sublimable film formation composition of the first embodiment includes a sublimable substance and the solvent A1 in which a saturation solubility of the sublimable substance is more than 10% by mass and a boiling point is lower by 5° C. or more than a boiling point of the sublimable substance at 1 atm.

The sublimable film formation composition of the second embodiment includes a sublimable substance, the solvent A2 in which a saturation solubility of the sublimable substance is more than 10% by mass, and the solvent B2 in which a content in the sublimable film formation composition is greater than a content of the solvent A2 and a boiling point is less than a boiling point of the sublimable substance at 1 atm and less than a boiling point of the solvent A2.

It is possible to suitably use the sublimable film formation compositions of the present embodiment in a production process of a substrate having an uneven structure on a surface and to suppress pattern collapse in the uneven structure of the substrate.

Figures 1A, 1B, 1C:
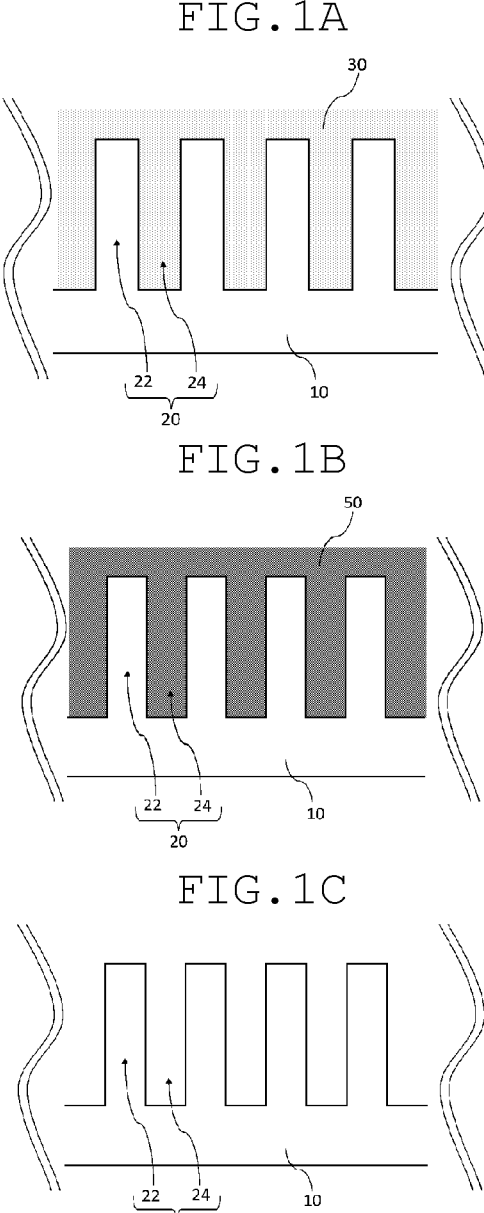
FIGS. 1A to 1C are cross-sectional views of steps in an example of steps for producing a substrate.
Figure 2:
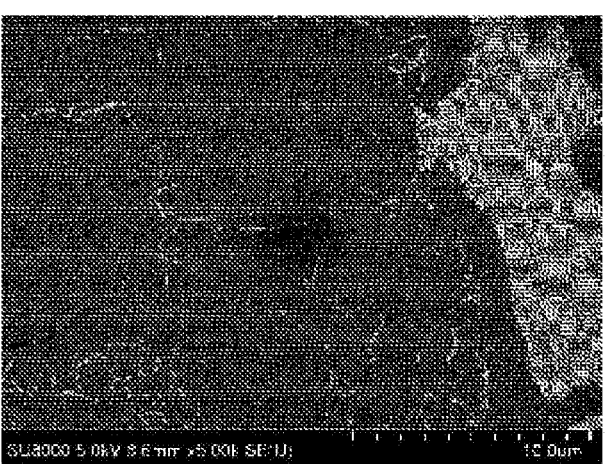
FIG. 2 is an SEM image of a substrate surface in Example 1.
Figure 3:
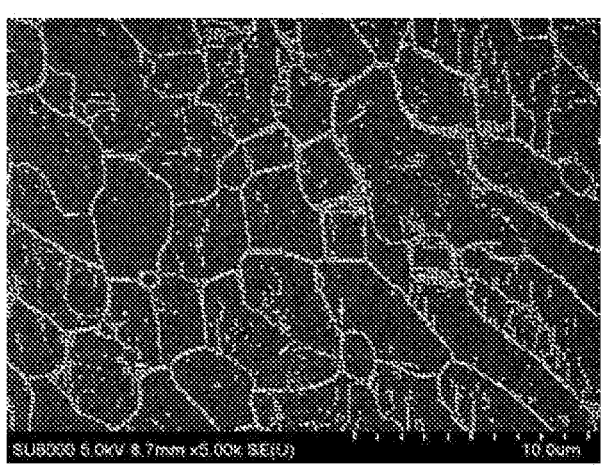
FIG. 3 is an SEM image of a substrate surface in Example 3.
Figure 4:
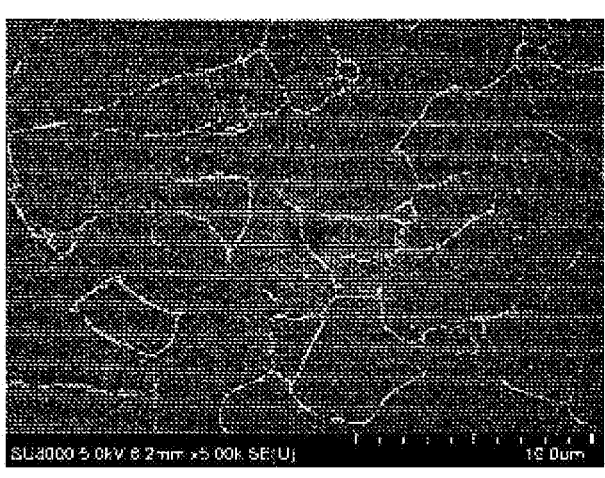
FIG. 4 is an SEM image of a substrate surface in Example 5.
Figure 5:
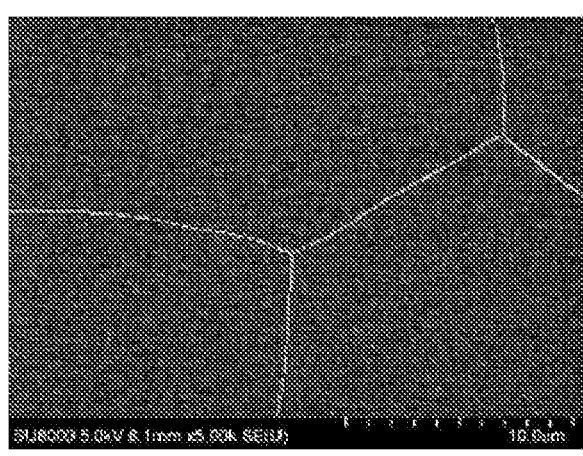
FIG. 5 is an SEM image of a substrate surface in Example 21.
Figure 6:
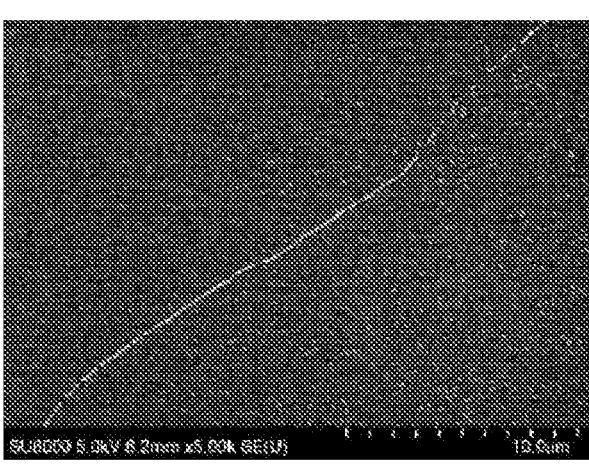
FIG. 6 is an SEM image of a substrate surface in Example 22.
Figure 7:
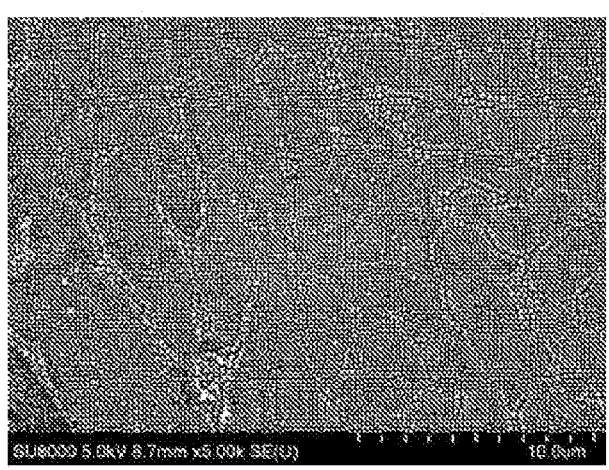
FIG. 7 is an SEM image of a substrate surface in Comparative Example 1.

FIGS. 1(a) to 1(c) are cross-sectional views of steps showing an example of steps for producing a substrate using a sublimable film formation composition.

FIG. 1A shows a step of supplying a sublimable film formation composition 30 to the surface of a substrate 10 and filling the sublimable film formation composition 30 in a recessed portion 24 in an uneven structure 20; FIG. 1B shows a step of causing the sublimable film formation composition 30 to coagulate to form a sublimable film 50; and FIG. 1C shows a step of removing the sublimable film 50 by sublimating the sublimable substance.

A description will be given of an example of producing a semiconductor chip. In this production process, a fine uneven pattern is formed on the substrate (wafer) surface through film deposition, lithography, etching, and the like, then a wet treatment such as a cleaning step using water or organic solvents is performed to make the wafer surface clean, and a drying step is also performed to remove liquids such as cleaning liquids and rinsing liquids attached to the wafer by the wet treatment.

It is known that, during the drying step, semiconductor substrates having fine uneven patterns are prone to deformation and collapse of the uneven patterns.

In order to dry a substrate on which an uneven pattern is formed using a sublimable substance, generally, a step is performed in which a residual liquid remaining in the uneven pattern is replaced by a treatment liquid including the sublimable substance.

According to the findings of the present inventors, it was found that, in a sublimable film formation composition including a sublimable substance and a solvent, by appropriately selecting a solvent in which the solubility of the sublimable substance is comparatively high and with a comparatively high volatility, or by appropriately combining two or more solvents, when the sublimable film formation composition is used in a production process for a substrate having an uneven structure, it is possible to suppress the occurrence of pattern collapse in the uneven structure of the substrate.

As shown in the first embodiment, the solvent A1 in which the sublimable substance solubility is moderate and which has moderate volatility may be adopted and, as shown in the second embodiment, the solvent A2 in which the sublimable film solubility is moderate and the solvent B2 having moderate volatility may be used together.

Although the detailed mechanism thereof is not clear, it is considered that, by using highly volatile solvents (the solvent A1 or the solvent B2)), which are more volatile than the sublimable substance, the film forming ability is high, while by using high solubility solvents (the solvent A1 or the solvent A2), in which the solubility of the sublimable substance is comparatively high, it is possible to suppress the excessive occurrence of precipitation of the sublimable substance at an early stage, thus, it is possible to suppress pattern collapse caused by the precipitated sublimable substances at an early stage.

In addition, in the technical field of substrates having a fine uneven structure, such as semiconductor wafers, pattern collapse is generally known as a state in which a pattern in a predetermined range collapses in a random direction, that is, referring to a planar collapse.

However, it was found that, in the types of pattern collapse, there is striated collapse, which is different from planar collapse.

Striated collapse basically refers to a state in which the pattern collapses continuously in a predetermined direction. Striated collapse may also be generated around regions where there is no predetermined pattern collapse. Even when it is possible to control the planar collapse and pattern collapse rate, there is a concern that striated collapse may occur.

According to the findings of the present inventors, it was found that, by using the solvent A1 or the solvent A2, which have an even higher sublimable substance solubility, and/or by using a sublimable substance with a comparatively low coagulation heat, it is possible to suppress striated collapse within pattern collapse.

Although the detailed mechanism thereof is not clear, it is considered that striated collapse is caused by distortion at the crystal grain boundaries of the sublimable film. For this reason, it is considered that by using solvents with high solubility, it is possible to suppress partial crystallization starting from the portion where the sublimable substance precipitated at an early stage, or, by using sublimable substances with a low coagulation heat to reduce the crystallinity, it is possible to suppress the striated collapse described above.

It is possible to suitably use the sublimable film formation composition of the present embodiment in a composition for drying uneven patterns used in a step of drying the uneven structure in the steps of producing a substrate having an uneven structure.

The sublimable substance may be a substance in which the entire film disappears due to a predetermined heat treatment, or may be a substance that disappears when the film is left at 23° C. under 1 atm. In the method for producing a substrate, the sublimable film is not a permanent film that remains permanently on the substrate, but is used as a sacrificial film to be removed in subsequent steps. Accordingly, it is possible to use the sublimable film formation composition as a composition for forming a sublimable sacrificial film.

A detailed description will be given below of the sublimable film formation composition of the present embodiment. (Sublimable Substance)

The sublimable film formation composition includes one or two or more sublimable substances.

In the present specification, sublimable substance refers to a substance having a vapor pressure in a solid state.

In principle, it is possible to use the sublimable substance as long as the substance is solid and has a vapor pressure at a specific temperature.

The lower limit of the coagulation point of the sublimable substance is, for example, 5° C. or higher, preferably 20° C. or higher, and more preferably 50° C. or higher under 1 atm. Due to this, in a case of being applied to the method for producing a substrate, it is unnecessary to treat the sublimable substance at an extremely low temperature for coagulation and the production stability of the semiconductor substrate is increased.

On the other hand, the upper limit of the coagulation point of the sublimable substance is, for example, 220° C. or lower, preferably 200° C. or lower, and more preferably 180° C. or lower under 1 atm. Due to this, in a case of being applied to the method for producing a substrate, it is unnecessary to treat the sublimable substance at an extremely high temperature for sublimation and the production stability of the semiconductor substrate is increased.

The lower limit of the coagulation heat of the sublimable substance is not particularly limited, but may be, for example, 1 J/g or more, preferably 5 J/g or more, and more preferably 10 J/g or more.

On the other hand, the upper limit of the coagulation heat of the sublimable substance is 200 J/g or less, preferably 100 J/g or less, and more preferably 50 J/g or less. Due to this, it is possible to suppress the occurrence of striated collapse.

The sublimable substance may be formed such that non-volatile substances becoming residues after sublimation are substantially not included. It is possible to remove non-volatile substances from the sublimable substance by separation methods such as sublimation refining or distillation. Substantially not included means 1% by mass or less in 100% by mass of the sublimable substance, preferably 0.5% by mass or less, or that a case of unavoidable mixing in may be acceptable.

The lower limit of the boiling point of the sublimable substance is, for example, 60° C. or higher, preferably 100° C. or higher, and more preferably 110° C. or higher under 1 atm. Due to this, it is possible to stably form sublimable films including sublimable substances.

On the other hand, the upper limit of the boiling point of the sublimable substance is, for example, 300° C. or lower, preferably 280° C. or lower, and more preferably 250° C. or lower under 1 atm. Due to this, refining of the sublimable substance is easy. In addition, in a normal temperature and normal pressure process, the sublimation of the sublimable substance is easy and the production efficiency is increased.

As the boiling point or sublimation point of a sublimable substance including a plurality of substances, the boiling point or sublimation point of the component with the highest content (% by mass) among the components included in the sublimable substance is adopted (however, in a case where there are two or more components with the highest content, the boiling point or sublimation point which is the highest temperature is adopted). For the boiling point of sublimable substances, the initial boiling point as defined in JIS K 2254:2018 (ISO 3405) is adopted. In cases where the sublimation point is typically used for a substance, the sublimation point is used.

In addition, for the coagulation point of the sublimable substance, the coagulation start temperature determined using DSC under a condition of –10° C./min is adopted. As the coagulation point of a sublimable substance including a plurality of substances, the coagulation point of the component with the highest content (% by mass) among the components included in the sublimable substance is adopted (however, in a case where there are two or more components with the highest content, the coagulation point which is the higher temperature is adopted).

The temperature range at which the sublimable substance is solid and has a vapor pressure (also referred to below as "sublimation temperature range") may, for example, be 10° C. or higher. Due to this, even when used in an environment of 20° C. to 25° C., which is a typical room temperature in a clean room, it is possible to coagulate the sublimable substance by cooling due to the heat of vaporization of the solvent in the sublimable film formation composition.

In addition, when the sublimation temperature range is in a range of 20° C. to 25° C., sublimation acceleration treatments such as heating and depressurization are not necessary and it is possible to sublimate the sublimable substances comparatively easily and to remove the sublimable film while adopting current substrate production process conditions as they are.

The vapor pressure when defining the sublimation temperature range is, for example, 10 Pa or more and preferably 50 Pa or more.

In the present specification, "to" indicates that the upper limit value and lower limit value are included, unless otherwise expressly stated.

Sublimable substances are not limited as long as application is possible to substrate materials such as semiconductors and examples thereof include non-halogenated sublimable substances S1 with a comparatively low coagulation heat, non-halogenated sublimable substances S2 with a comparatively high coagulation heat, sublimable substances S3 where the difference between the coagulation point and boiling point is comparatively small, halogen-containing sublimable substances S4 including halogen elements, and the like. The above may be used alone or in a combination of two or more.

The coagulation heat of the non-halogenated sublimable substance S1 is preferably 50 J/g or less and more preferably 40 J/g or less. For S1, the difference between the coagulation point and the boiling point tends to be comparatively large, thus, distillation and refining as a liquid are possible. The use of S1 makes it possible to prevent the occurrence of striated collapse.

The coagulation heat of the non-halogenated sublimable substance S2 is preferably over 50 J/g.

The difference between the coagulation point and the boiling point of the sublimable substance S3 is, for example, 50° C. or less, preferably 40° C. or less, and more preferably 30° C. or less.

As the halogen-containing sublimable substance S4, a fluorine-containing sublimable substance including a fluorine element as a halogen element may be used.

Among the above, the sublimable substances S1 to S3 are suitably used from the viewpoint of pattern collapse suppression.

Examples of sublimable substances include norbornene, norbornane, camphor, pyrazine, 2,3-dichloropyrazine, 2,6-dichloropyrazine, 2,6-dichloropyridine, tetrahydrodicyclopentadiene, dimethyl oxalate, isoborneol, neopentyl alcohol, neopentyl glycol, ethylene carbonate, and the like. Among the above, neopentyl alcohol, camphor, pyrazine, tetrahydrodicyclopentadiene, dimethyl oxalate, isoborneol, and ethylene carbonate may be used. The above may be used alone or used in a combination of two or more. In addition, in a case where optical isomers are present, one or both may be used.

The lower limit of the content of the sublimable substance is, for example, 0.1% by mass or more in the sublimable film formation composition, preferably 0.5% by mass or more, and more preferably 0.8% by mass or more. Due to this, in the sublimable film formation composition, there is a tendency for the sublimable substance to uniformly coagulate more easily.

On the other hand, the upper limit of the content of the sublimable substance is, for example, 80% by mass or less in the sublimable film formation composition, preferably 50% by mass or less, and more preferably 40% by mass or less. Due to this, the cooling effect due to the heat of vaporization of the solvent is obtained more easily and there is a tendency for the coagulation of the sublimable substance to accelerate more easily, which is preferable. In addition, it is easier to keep the time required for sublimation (sublimation time) short, which is preferable.

(Solvent)

The sublimable film formation composition of the present embodiment includes one or two or more solvents A in which the saturation solubility of the sublimable substance is more than 10% by mass. Solvent A is defined to encompass the solvent A1 and the solvent A2 described above.

By using the solvent A having the ability to dissolve the sublimable substance, when the sublimable film formation composition is supplied onto the substrate via a nozzle, it is possible to suppress the occurrence of coagulation of the sublimable substance at the tip of the nozzle.

The saturation solubility is determined from the saturation concentration (% by mass) of the sublimable substance dissolved in the solvent.

In a case where a plurality of types of solvent are included, a saturation solubility value individually specified for each solvent is adopted.

In a case where the sublimable film formation composition includes a plurality of sublimable substances, as the saturation solubility, the saturation concentration of the sublimable substance with the highest content ratio (% by mass) in the composition is adopted (however, in a case where two or more kinds of sublimable substance with the highest content are present, the largest value of the saturation concentration is adopted).

The lower limit of the saturation solubility of the sublimable substance with respect to the solvent A is more than 10% by mass, preferably 30% by mass or more, more preferably 40% by mass or more, even more preferably 50% by mass or more, and yet more preferably 60% by mass or more. Due to this, it is possible to reduce the pattern collapse ratio.

On the other hand, the upper limit of the saturation solubility of the sublimable substance with respect to the solvent A may be, for example, 99% by mass or less or 95% by mass or less.

In addition, the sublimable film formation composition may use the solvent A compatible with respect to the residual liquid remaining on the substrate surface. Due to this, it is possible for the residual liquid to be efficiently replaced by the sublimable film formation composition and for a residual liquid drying treatment to be stably performed.

Examples of the residual liquid include common solvents used in the semiconductor cleaning step, specifically, water, alcohols with 3 or fewer carbon atoms (for example, methanol, 1-propanol, 2-propanol, and the like), mixtures thereof, and the like.

Having compatibility means that the dissolved amount of the solvent used in the cleaning step with respect to 1 part by mass of the solvent A at 25° C. and 1 atm is, for example, 0.05 parts by mass or more.

The sublimable film formation composition of the first embodiment includes one or two or more of the solvent A1 having a saturation solubility of more than 10% by mass of the sublimable substance and a boiling point lower by 5° C. or more than the boiling point of the sublimable substance at 1 atm.

The solvent A1 is selected from solvents that satisfy a condition (1) that the boiling point thereof is lower by 5° C. or more than the boiling point of the sublimable substance at 1 atm.

In the condition (1), the (boiling point of the sublimable substance at 1 atm—boiling point of the solvent A1) may be 5° C. or more, preferably 50° C. or more, and more preferably 80° C. or more and may be 200° C. or less and preferably 180° C. or less.

In the present specification, in a case where a plurality of solvents are included, as the boiling point of each solvent, the azeotropic point is used in a case of an azeotropic solvent. In a case where the solvent is not an azeotropic solvent, the boiling point specified for each solvent is adopted individually.

In the sublimable film formation composition of the first embodiment, it is considered that, by including at least one such solvent A1, the highly soluble solvent A1 suppresses excessive early-stage precipitation of the sublimable substance and the solvent A1 which is more highly volatile than the sublimable substance is able to accelerate film formation (coagulation of the sublimable substance) of the sublimable film due to the heat of vaporization. Due to this, after forming and removing the sublimable film, it is also possible to reduce the pattern collapse rate and to suppress striated collapse.

In addition to the solvent A described above, it is possible for the sublimable film formation composition of the present embodiment to include one or two or more of the solvents B in which the boiling point is lower than the boiling point of the sublimable substance at 1 atm. The solvent B is defined to encompass the solvent B1 and the solvent B2 described above.

The sublimable film formation composition of the first embodiment may include one or two or more of the solvent A1 described above and one or two or more of the solvent B1 in which the boiling point is lower than the boiling point of the solvent A1.

As long as the solvent B1 is a solvent in which the boiling point is lower than that of the solvent A1 among the solvents B, the saturation solubility of the sublimable substance in the solvent B1 is not particularly limited and use is possible even if lower than the saturation solubility of the solvent A1. The difference between the boiling point of the solvent A1 and the boiling point of the solvent B1 is, for example, 5° C. or more, preferably 10° C. or more, and more preferably 15° C. or more and may be 200° C. or less or may be 150° C. or less.

The boiling point of the solvent B1 is, for example, 15° C. to 85° C., preferably 20° C. to 80° C., and more preferably 25° C. to 70° C.

The lower limit of the content of the solvent A1 is, for example, 0.5% by mass or more in the sublimable film formation composition, preferably 0.8% by mass or more, and more preferably 0.9% by mass or more.

In addition, in a case where the solvent A1 is the main component of the solvent in the sublimable film formation composition, the content of the solvent A1 in the sublimable film formation composition may be 50% by mass or more, more preferably 80% by mass or more, and even more preferably 90% by mass or more. At this time, in a case where other solvents are used, the solvent B1 is preferably used as the solvent. In such a case, the content of the solvent A1 in the sublimable film formation composition may be a value greater than the solvent B1.

On the other hand, in a case where the solvent of the sublimable film formation composition includes substantially only the solvent A1 and/or a case where the solvent A1 is the main component of the solvent of the sublimable film formation composition, the upper limit of the content of the solvent A1 may be, for example, 99.9% by mass or less, preferably 99.5% by mass or less, and more preferably 99.2% by mass or less. In addition, in a case where the sublimable film formation composition includes the solvent A1 and the solvent B1 and the main component of the solvent is not A1, the content of the solvent A1 in the sublimable film formation composition may be, for example, less than 50% by mass, preferably 30% by mass or less, and more preferably 15% by mass or less.

The sublimable film formation composition of the second embodiment includes one or two or more of the solvents A2, in which the saturation solubility of the sublimable substance is more than 10% by mass, and one or two or more of the solvent B2, in which the content in the sublimable film formation composition is greater than the content of the solvent A2 and the boiling point is less than the boiling point of the sublimable substance at 1 atm and is less than the boiling point of the solvent A2.

The solvent A2 is selected from the solvents A described above. (The boiling point of the sublimable substance at 1 atm—boiling point of the solvent A2) may be 0° C., may be 0° C. or more and less than 5° C., or may be 5° C. or more and 200° C. or less. In addition, from the viewpoint of easy coagulation of the sublimable substance, for example, it may be that 0° C. or more and 200° C. or less is preferable and 5° C. or more and 200° C. or less more preferable.

The solvent B2 is a solvent capable of accelerating the film formation of the sublimable film by volatilizing before the solvent A2, and, as long as the boiling point is lower than the boiling point of the solvent A2 and the boiling point of the sublimable substance, the saturation solubility of the sublimable substance is not particularly limited and use is possible even if smaller than the saturation solubility of the sublimable substance in solvent A2.

However, the content of the solvent B2 in the sublimable film formation composition is greater than the content of the solvent A2. Preferably, the solvent B2 may be included as the main component in the sublimable film formation composition. The main component means that the lower limit of the content of the solvent B2 in the sublimable film formation composition is, for example, 50% by mass or more, preferably 70% by mass or more, and more preferably 90% by mass or more. The upper limit of the content of the solvent B2 may be, for example, 99.8% by mass or less, 99.5% by mass or less, or 99% by mass or less.

In the sublimable film formation composition including the solvent B2 as a main component, the content of the solvent A2 is, for example, 0.1% by mass to 30% by mass and preferably 0.5% by mass to 10% by mass.

In the sublimable film formation composition of the second embodiment, by including at least one of each of the solvent A2 and the solvent B2, the formation of the sublimable film (the coagulation of the sublimable substance) is accelerated by the relative volatilization and the heat of vaporization of the solvent B2. At this time, it is considered that, the sublimable substance and the solvent A2 remain, but, in this residue, the solvent A2 is able to dissolve the sublimable substance, thus, it is possible to suppress excessive early-stage precipitation of the sublimable substance. Due to this, after forming and removing the sublimable film, it is also possible to reduce the pattern collapse rate and to suppress striated collapse. In addition, it was also found that, in the Examples described below, the sublimable film formation composition of the second embodiment tended to reduce the pattern collapse rate in particular.

Including the solvent B2 as a main component in the sublimable film formation composition of the second embodiment makes it possible to reduce the film forming time of the sublimable film and also to keep the production costs of the substrate described above low.

In addition, the difference between the boiling point of the solvent A2 and the boiling point of the solvent B2 is not particularly limited, as long as the solvent A2 is able to remain after the solvent B2 has volatilized, and may be for example, 5° C. or more, preferably 10° C. or more, more preferably 15° C. or more, and even more preferably more than 20° C. and may be 200° C. or less or 150° C. or less.

The upper limit of the boiling point of the solvent B2 is, for example, 85° C. or lower, preferably 80° C. or lower, and more preferably 70° C. or lower.

On the other hand, the lower limit of the boiling point of the solvent B2 may be, for example, 15° C. or higher, preferably 20° C. or higher, and more preferably 25° C. or higher.

In a case where two or more of the solvents A1 are included in the first embodiment, as an example, the second and subsequent solvents A1 may be selected from solvents in which a saturation solubility of the sublimable substance with respect to the solvent A1 is 40% by mass or more and which have a boiling point of 200° C. or lower and are preferably selected from solvents in which a saturation solubility of the sublimable substance is 75% by mass or more and which have a boiling point of 180° C. or lower.

In a case where two or more of the solvent A2 and/or the solvent B2 are included in the second embodiment, as an example, the second and subsequent solvents A2 may be selected from solvents in which a saturation solubility of the sublimable substance with respect to the solvent A2 is 40% by mass or more and which have a boiling point which is the boiling point of the sublimable substance or lower, preferably selected from solvents in which a saturation solubility of the sublimable substance is 50% by mass or more and which have a boiling point of 210° C. or lower, more preferably selected from solvents in which a saturation solubility of the sublimable substance is 60% by mass or more and which have a boiling point of 200° C. or lower, and even more preferably selected from solvents in which a saturation solubility of the sublimable substance is 75% by mass or more and which have a boiling point of 180° C. or lower.

In addition, in a case where two or more of the solvents A2 and one or more of the solvents B2 are included, the smaller the boiling point difference between the solvents A2, the more likely the solvents A2 are to remain when the solvent B2 is volatilized, which is preferable. The boiling point difference described above is not particularly limited as long as it is possible to exhibit the effects as the solvent A2, but for example, it may be that the difference between the highest boiling point and lowest boiling point of the two or more solvents A2 is preferably 20° C. or less, more preferably 15° C. or less, and even more preferably 10° C. or less. That is, the second and subsequent solvents A2 may have a difference in boiling point from the first solvent A1 of 10° C. or less, 15° C. or less, or 20° C. or less, for example. In addition, at this time, the boiling point of the solvent B2 is smaller than the lowest boiling point of the solvent A2.

In addition, the second and subsequent solvents B2 may be selected from solvents having a boiling point of, for example, 83° C. or lower, preferably 80° C. or lower, and more preferably 70° C. or lower.

Examples of solvents used in the sublimable film formation composition include hydrocarbons, ethers, alcohols, ketones, esters, sulfoxides, nitrogen-containing compounds, and the like. Each of these solvent types may have one or more halogen atoms such as fluorine atoms and chlorine atoms in the molecule. The above may be used alone or in a combination of two or more.

As hydrocarbons, for example, it is possible to use alkanes or cycloalkanes with 4 to 10 carbon atoms, alkenes or cycloalkenes with 4 to 10 carbon atoms, aromatic hydrocarbons with 6 to 10 carbon atoms, and the like.

Specific examples of hydrocarbons include pentane, 3-methylpentane, hexane, heptane, octane, nonane, decane, isododecane, cyclopentane, cyclohexane, methylcyclohexane, 1,1-dichloroethane, 1,2-dichloroethane, 1,2-dichloroethylene, cis-1-chloro-3,3,3-trifluoropropene (1233Z), trans-1-chloro-3,3,3-trifluoropropene (1233E), toluene, benzene, xylene, and the like.

As ethers, for example, it is possible to use chained or cyclic ether compounds with 3 to 10 carbon atoms.

Specific examples of ethers include tetrahydrofuran, diethyl ether, dipropyl ether, diisopropyl ether, dibutyl ether, tert-butyl methyl ether, dioxane, 1,1,1,2,2,3,3,4,4-nonafluorobutyl methyl ether (Novec 7100), ethylene glycol monomethyl ether, ethylene glycol dimethyl ether, diethylene glycol dimethyl ether, propylene glycol monomethyl ether, propylene glycol dimethyl ether, and the like.

As alcohols, for example, it is possible to use primary, secondary, and tertiary alcohols with 1 to 10 carbon atoms, and the like.

Specific examples of alcohols include methanol, ethanol, 1-propanol, 2-propanol (IPA), 1-butanol, 2-butanol, cyclopentanol, cyclohexanol, 2-methyl-2-butanol, 4-methyl-2-pentanol, ethylene glycol, propylene glycol, 2,2,2-trifluoroethanol, 1,1,1,3,3,3-hexafluoro-2-propanol, 1,3-propanediol, and the like.

As ketones, for example, it is possible to use ketone compounds with 3 to 6 carbon atoms.

Specific examples of ketones include acetone, acetylacetone, methyl ethyl ketone, methyl propyl ketone, methyl butyl ketone, and the like.

Examples of esters include chained or cyclic ester compounds with 3 to 6 carbon atoms.

Specific examples of esters include methyl acetate, ethyl acetate, n-propyl acetate, isopropyl acetate, butyl acetate, methyl lactate, ethyl lactate, ethyl acetoacetate, ethyl trifluoroacetate, γ-butyrolactone, ethylene glycol acetate, propylene glycol acetate, ethylene glycol monomethyl ether acetate, propylene glycol monomethyl ether acetate, and the like.

Examples of sulfoxides include dimethyl sulfoxide and the like.

Examples of nitrogen-containing compounds include formamide, N,N-dimethylformamide, N,N-dimethylacetamide, N-methyl-2-pyrrolidone, pyridine, and the like.

As the solvent A1, the solvent A2, the solvent B1, and the solvent B2, respectively, it is possible to select one or two or more of the solvents described above according to the sublimable substance included in the sublimable film formation composition.

From the viewpoint of achieving both high solubility in the sublimating agent and compatibility with water or an alcohol with 3 or fewer carbon atoms which is the residual liquid remaining on the substrate surface, as the solvent A1 and the solvent A2, in particular, it is preferable to include at least one selected from the group consisting of ethers, alcohols, ketones, esters, and hydrocarbons having one or more halogen atoms such as fluorine atoms and chlorine atoms in the molecule. Possible specific examples thereof include tetrahydrofuran, methanol, ethanol, 1-propanol, 2-propanol, 1-butanol, 2-butanol, 2-methyl-2-butanol, acetone, methyl acetate, ethyl acetate, 1,1-dichloroethane, 1,2-dichloroethane, 1,2-dichloroethylene, cis-1-chloro-3,3,3-trifluoropropene, trans-1-chloro-3,3,3-trifluoropropene, and the like.

In addition, among the above, more preferable examples thereof include methanol, ethanol, 1-propanol, 2-propanol, 2-butanol, 2-methyl-2-butanol, acetone, methyl acetate, cis-1-chloro-3,3,3-trifluoropropene, trans-1-chloro-3,3,3-trifluoropropene, and the like.

From the viewpoint of achieving both high volatility and compatibility with water or an alcohol with 3 or fewer carbon atoms which is the residual liquid remaining on the substrate surface, as the solvents B1 and B2, it is preferable to include at least one selected from the group consisting of hydrocarbons, ethers, alcohols, ketones, and esters. Possible specific examples thereof include pentane, 3-methylpentane, hexane, heptane, cyclopentane, cyclohexane, methylcyclohexane, 1,1-dichloroethane, 1,2-dichloroethane, 1,2-dichloroethylene, cis-1-chloro-3,3,3-trifluoropropene, trans-1-chloro-3,3,3-trifluoropropene, toluene, benzene, xylene, diethyl ether, dipropyl ether, diisopropyl ether, tetrahydrofuran, methanol, ethanol, 1-propanol, 2-propanol, 1-butanol, 2-butanol, acetone, methyl acetate, ethyl acetate, and the like. Among the above, more preferable examples thereof include pentane, hexane, cyclopentane, cyclohexane, methylcyclohexane, cis-1-chloro-3,3,3-trifluoropropene, trans-1-chloro-3,3,3-trifluoropropene, diethyl ether, tetrahydrofuran, methanol, ethanol, 1-propanol, 2-propanol, acetone, methyl acetate, and the like.

(Other Solvents)

In addition to the solvent A1, the solvent A2, the solvent B1, and the solvent B2, the sublimable film formation composition may also include a solvent C for the purpose of adjusting the wettability to the substrate and/or the uneven pattern, in a range in which the effect of the present invention is not impaired, or the sublimable film formation composition may be formed to substantially not include the solvent C.

Examples of solvent C include water, hydrocarbons, esters, ethers, ketones, sulfoxide solvents, alcohols, derivatives of polyhydric alcohols, nitrogen-containing compounds, and the like, and solvents which do not fall under the solvents used as essential components described above.

Examples of the hydrocarbons described above are toluene, benzene, xylene, pentane, 3-methylpentane, hexane, heptane, octane, nonane, decane, cyclopentane, cyclohexane, methylcyclohexane, 1,1-dichloroethane, 1,2-dichloroethane, 1,2-dichloroethylene, cis-1-chloro-3,3,3-trifluoropropene (1233Z), trans-1-chloro-3,3,3-trifluoropropene (1233E), and the like, examples of the esters described above are ethyl acetate, butyl acetate, methyl acetate, n-propyl acetate, isopropyl acetate, butyl acetate, methyl lactate, ethyl lactate, ethyl acetoacetate, ethyl trifluoroacetate, γ-butyrolactone, and the like, examples of the ethers described above are diethyl ether, dipropyl ether, diisopropyl ether, dibutyl ether, tert-butyl methyl ether, tetrahydrofuran, dioxane, 1,1,1,2,2,3,3,4,4-nonafluorobutylmethyl ether (Novec 7100) and the like, examples of the ketones described above are acetone, acetylacetone, methyl ethyl ketone, methyl propyl ketone, methyl butyl ketone, and the like, examples of the sulfoxide solvent described above are dimethyl sulfoxide and the like, examples of alcohols are methanol, ethanol, 1-propanol, 2-propanol, butanol, 4-methyl-2-pentanol, ethylene glycol, 2-methyl-2-butanol, 4-methyl-2-pentanol, ethylene glycol, propylene glycol, 2,2,2-trifluoroethanol, 1,1,1,3,3,3-hexafluoro-2-propanol, 1,3-propanediol, and the like, examples of the derivatives of polyhydric alcohol described above are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, and the like, examples of the nitrogen-containing compound described above are formamide, N,N-dimethylformamide, N,N-dimethylacetamide, N-methyl-2-pyrrolidone, pyridine, and the like, and among the above, solvents not corresponding to the solvents A1, A2, B1, and B2 are examples.

The lower limit of the total content of solvents in the sublimable film formation composition is, for example, 20% by mass or more, preferably 50% by mass or more, and even more preferably 60% by mass or more. Due to this, the cooling effect due to the heat of vaporization of the solvent is obtained more easily and there is a tendency for the coagulation of the sublimable substance to accelerate proceed more easily, which is preferable.

On the other hand, the upper limit of the total content of solvent in the sublimable film formation composition is, for example, 99.9% by mass or less, preferably 99.5% by mass or less and even more preferably 99.2% by mass or less. Due to this, there is a tendency for the sublimable substance to uniformly coagulate more easily on the substrate, which is preferable.

The sublimable film formation composition is a liquid, preferably a solution, at least when supplied to the substrate surface. From the viewpoint of easy supply in a stable manner, being liquid (preferably a solution) at −15° C. to 50° C. is preferable and being liquid (preferably a solution) at 0° C. to 40° C. is more preferable. Furthermore, from the viewpoint of simplification of the equipment configuration, being liquid (preferably a solution) at 20° C. to 30° C. such that no heat retention or heating is necessary for the dispensing mechanism is particularly preferable.

In addition, from the viewpoint of easy handling (producing, storage, transport, and the like), the sublimable film formation composition may be liquid (preferably a solution) at −15° C. to 50° C. and is more preferably liquid (preferably a solution) at 0° C. to 40° C. Furthermore, from the viewpoint of simplification of the equipment configuration, being liquid (preferably a solution) at 20° C. to 30° C. such that no heat retention or heating is necessary for the liquid transfer mechanism or storage container is particularly preferable.

(Method for Producing Substrate)

As shown in FIGS. 1A to 1C, an example of a method for producing a substrate of the present embodiment includes a step of preparing the substrate 10 having the uneven structure 20 on a surface, a step of supplying the sublimable film formation composition 30 including a sublimable substance on the surface (FIG. 1A), a step of causing the sublimable film formation composition 30 to coagulate and forming the sublimable film 50 on the surface (FIG. 1B), and a step of sublimating the sublimable substance to remove the sublimable film 50 (FIG. 1C).

As the sublimable film formation composition 30 including the sublimable substance in FIG. 1A, the sublimable film formation composition of the present embodiment may be used or the sublimable film formation composition of the first embodiment or second embodiment described above may be used.

The sublimable film formation composition of the present embodiment is used to suppress pattern collapse of the uneven structure 20 formed on the substrate 10.

A detailed description will be given below of the method for producing a substrate.

In the preparation step of the substrate 10 described above, the following method may be used, which is an example of a method for forming the uneven structure 20 on the surface of the substrate 10.

First, after applying a resist to the wafer surface, the resist is exposed via a resist mask and the exposed resist or the unexposed resist is removed to produce a resist having a desired uneven pattern. In addition, it is possible to obtain a resist having an uneven pattern by pressing a mold having a pattern onto the resist. Next, the wafer is etched. At this time, the substrate surface corresponding to the recessed portions of the resist pattern is selectively etched. Finally, when the resist is peeled off, a wafer (substrate 10) having the uneven structure 20 on the surface is obtained.

The wafer on which the uneven structure 20 is formed and the material of the uneven structure 20 are not particularly limited and, as a wafer, it is possible to use various types of wafers such as silicon wafers, silicon carbide wafers, wafers formed of a plurality of components including silicon elements, sapphire wafers, various compound semiconductor wafers, and plastic wafers. In addition, for the material of the uneven structure 20, it is possible to use silicon-based materials such as silicon oxide, silicon nitride, polycrystalline silicon, and single-crystal silicon, metal-based materials such as titanium nitride, tungsten, ruthenium, tantalum nitride, and tin, and materials combining the above, resist (photoresist) materials, and the like.

FIG. 1A is a cross-sectional view showing an example of an uneven pattern 20. In the cross-sectional structure (in the substrate thickness direction) in the pattern of the uneven pattern 20, at least one or more pattern dimensions of the width and height thereof, or, at least one or more pattern dimensions of the width (length in the X-axis direction), the height (length in the Y-axis direction) and the depth (length in the Z-axis direction) in a three-dimensional structure (three-dimensional coordinates of XYZ) in the pattern of the uneven pattern 20, may be, for example, 30 nm or less, 20 nm or less, or 10 nm or less. Even in a case where the substrate 10 having the fine uneven pattern 20 is used, it is possible to reduce the pattern collapse rate by using the composition for drying of the present embodiment.

In the cross-sectional views of FIGS. 1A to 1C, the inclination of the uneven pattern 20 is parallel to (does not intersect with) the substrate thickness direction, but it is possible to suitably use the composition for drying of the present embodiment even in a case where the inclination of the uneven pattern 20 is not parallel to the substrate thickness direction. "A case where . . . not parallel" means that, for example, suitable use is also possible in the cross-sectional structure of FIGS. 1A to 1C, in a case where the inclination of the uneven pattern 20 is the direction intersecting the substrate thickness direction, the inclination of the uneven pattern 20 intersects (excluding orthogonally) the substrate thickness direction, or the like.

Such sublimable film formation compositions are suitable, for example, for use in treating the substrate 10 having the uneven structure 20 with a pattern dimension of 30 nm or less and preferably 20 nm or less.

The lower limit of the aspect ratio of the convex portion 22 may be, for example, 3 or more, 5 or more, or 10 or more. It is possible to suppress pattern collapse even in the uneven structure 20 having the convex portion 22 with a fragile structure.

On the other hand, the upper limit of the aspect ratio of the convex portion 22 is not particularly limited, but may be 100 or less.

The aspect ratio of the convex portion 22 is expressed as the value obtained by dividing the height of the convex portion 22 by the width of the convex portion 22.

After the formation of the uneven structure 20, the surface of the substrate 10 is cleaned using a cleaning liquid such as water or an organic solvent (cleaning step).

After the cleaning step, as shown in FIG. 1A, a sublimable film formation composition, which is a liquid, is supplied to the uneven structure 20 formed on the surface of the substrate 10. The sublimable film formation composition supplied at this time is preferably liquid in a 20° C. to 30° C. environment and more preferably a solution. The supply may be carried out to fill part or all of the recessed portion 24 of the uneven structure 20 (may be described as "a step of supplying the sublimable film formation composition", or simply "filling step" or "supplying step"). The supply may be carried out, for example, in an environment of 20° C. to 30° C.

It is possible to use a known method for the method for supplying the sublimable film formation composition, for example, a single wafer method as typified by a spin method where, while wafers are held almost horizontally one by one and rotated, a composition is supplied near the center of rotation to displace cleaning liquid or the like held in the uneven pattern of the wafer so as to fill the composition therein, a batch method, in which a plurality of wafers are immersed in a composition tank to displace the cleaning liquid or the like held in the uneven patterns of the wafers so as to fill the composition therein, or the like may be used.

The used cleaning liquid remains on the surface of the substrate 10 after the cleaning step. By selecting, as the cleaning liquid, a type which dissolves in the sublimable film formation composition, it is possible to replace the remaining cleaning liquid with the sublimable film formation composition comparatively easily. Therefore, it is usually preferable to use at least one alcohol selected from alcohols with 3 or fewer carbon atoms, such as methanol, 1-propanol, and 2-propanol, as the cleaning liquid.

The sublimable substance used in the sublimable film formation composition may be refined in advance. For the refining of the sublimable substance, a separation method such as sublimation refining or distillation is used.

After the filling step, as shown in FIG. 1B, the sublimable substance in the sublimable film formation composition 30 is coagulated to form the sublimable film 50 including the coagulated sublimable substance on the uneven structure 20, (may be described as "a step of forming a sublimable film" or simply "coagulation step"). It is possible for the sublimable film 50 filled inside the recessed portion 24 of the uneven structure 20 to suppress the pattern collapse of the uneven structure 20.

In the coagulation step, the solid sublimable substance may be precipitated by cooling or the solvent may be evaporated by heating or by applying suitable environmental conditions and the solid sublimable substance may be precipitated by the heat of vaporization.

In the present embodiment, appropriately selecting the solvent A1, the solvent A2, the solvent B1, and the solvent B2 used in the sublimable film formation composition as described above also makes it possible to perform the volatilization (drying) of the solvent, for example, under normal temperature and normal pressure (20° C. to 25° C., 1 atm).

In addition, by setting the lower limit of the coagulation point of the sublimable substance to the lower limit value described above or more, extreme cooling becomes unnecessary and it is possible to cause the sublimable substance to coagulate by the heat of vaporization of the solvent.

When the coagulation step is carried out under normal temperature and normal pressure, as necessary, for example, the volatilization of the solvent may be accelerated by a method for rotating the substrate 10 or by blowing an inert gas on the substrate 10.

After the coagulation step, as shown in FIG. 1C, the solid sublimable substance is sublimated to remove the sublimable film 50 on the uneven structure 20 (may be described as "a step of removing a sublimable film" or simply "removal step").

It is possible to appropriately select the method for sublimating the sublimable substance according to the boiling point of the sublimable substance. For example, in a case where the boiling point is comparatively low, the substance may be sublimated under normal temperature and normal pressure, but heating or depressurization may be used as necessary.

The production method shown in FIGS. 1A to 1C has a wafer pattern as a target, but the present invention is not limited thereto. The method for producing a substrate of the present embodiment is also able to suppress the collapse of the resist pattern by using the sublimable film formation composition of the present invention in the cleaning and drying steps thereof with the resist pattern as a target.

Although a description was given of a production method in which the supplying step described above is carried out after a cleaning step, without being limited thereto, the supplying step may be carried out after various treatments carried out on the uneven structure 20. For example, the supplying step may be performed after a treatment with a chemical solution for forming a water-repellent protective film on the uneven structure 20.

In addition to the steps described above, the method for producing a substrate may also use one or two or more known treatments in combination. For example, after the removal step described above, a surface treatment such as a plasma treatment may be performed.

A description was given above of the embodiments of the present invention, but these are examples of the present invention and it is possible to adopt various configurations other than those described above. In addition, the present invention is not limited to the embodiments described above and variations, improvements, and the like in a range able to achieve the purpose of the present invention are included in the present invention.

In addition, in the present specification, ordinal numerals such as "first", "second", and "third" and symbols such as "A" and "B", unless otherwise stated, are added merely to distinguish similarly named configurations and do not signify a specific feature (for example, order or importance) of the configuration.

EXAMPLES

A detailed description will be given below of the present invention with reference to Examples, but the present invention is not limited in any way to the description of these Examples.

<Preparation of Sublimable Film Formation Composition>

Examples 1 to 31, Comparative Example 1

Sublimable film formation compositions were prepared by mixing and dissolving a sublimating agent (sublimable substance) in a solvent at approximately 25° C. to the sublimating agent concentration (% by mass) listed in Tables 1-1 and 1-2. The boiling point of the sublimating agent (° C.), the boiling point of the solvent (° C.), and the saturation solubility (% by mass) of the sublimating agent in the solvent are shown in Table is 1-1 and 1-2.

Saturation solubility signifies the saturation concentration of the sublimating agent dissolved in the solvent and was measured as follows.

First, a mixture of sublimating agent and solvent was prepared by mixing the sublimating agent and solvent at a mass ratio of approximately 3:1, heating to 40° C. once, and cooling to room temperature (approximately 25° C.). In a case where a solid and a liquid coexisted in the mixture at room temperature, 10 μL of the liquid part was collected with a micro syringe, diluted 100 times (volume ratio) with a dilution solvent, and then analyzed by gas chromatography and converted to a mass ratio to determine the saturation solubility (% by mass). In a case where no precipitation of the sublimating agent occurred at room temperature and the solution was uniform, the same procedure was performed by increasing the amount of sublimating agent with respect to the solvent. In addition, in a case where the liquid portion was small at room temperature and difficult to collect with a micro syringe, the same procedure was performed by increasing the amount of solvent with respect to the sublimating agent. The calculation of the mass ratio based on gas chromatography was performed using a Shimadzu Corporation model GC-2010 gas chromatograph with a capillary column (model T C-1, manufactured by G. L. Sciences Inc., length 30 m, liquid phase thickness 5 μm, inner diameter 0.32 mm) attached thereto and an area ratio detected by an FID detector was converted to a mass ratio based on an area ratio of a diluent solution dissolving the sublimating agent and solvent at 1% by mass each. It is necessary for the dilution solvent used in the gas chromatography to be selected from solvents in which a sufficiently separated peak is obtained by gas chromatography from the sublimating agent and the solvent which is the measurement target, specifically, a solvent that is 0.1 minutes or more apart in the development time on the chromatogram.

Examples 32 to 64, Comparative Examples 2, 3

Sublimable film formation compositions were prepared by mixing and dissolving a sublimating agent (sublimable substance) in at least one or more of a solvent 1 to a solvent 3 at approximately 25° C. to the mixing ratios (% by mass) listed in Tables 2-1 and 2-2. The boiling point (° C.) of the sublimating agent and the boiling point (° C.) of the solvent are shown in Tables 2-1 and 2-2 and the saturation solubility (% by mass) of the sublimating agent in the solvent is shown in Table 4.

Examples 65 to 75

Sublimable film formation compositions were prepared by mixing and dissolving a sublimating agent 1 and/or a sublimating agent 2 (sublimable substances) in the solvent 1 and the solvent 2 at approximately 25° C. to the mixing ratios (% by mass) listed in Tables 3-1 and 3-2. The boiling point (° C.) of the sublimating agent and the boiling point (° C.) of the solvent are shown in Tables 3-1 and 3-2 and the saturation solubility (% by mass) of the sublimating agent in the solvent is shown in Table 4.

The coagulation heat and coagulation point of the sublimating agents listed in Tables 1 to 4 are shown in Table 5.

<Production of Substrate>

First, a silicon substrate in which an uneven structure having a plurality of approximately columnar convex portions with an aspect ratio of 22 in a cross-sectional view and a pattern width of 19 nm, with a pitch of 90 nm (total distance between the width of the convex portions and the adjacent intervals of the convex portions) was formed on a surface was cut out to dimensions of 1 cm×1.5 cm to prepare a substrate for evaluation.

Subsequently, the surface of the uneven structure of the substrate for evaluation was then dry-cleaned by UV/O$_3$ irradiation.

Subsequently, the substrate for evaluation was placed in a spin coater and 2-propanol was supplied to achieve a state in which the liquid (2-propanol) was held in the recessed portions in the uneven structure.

Subsequently, the sublimable film formation composition in a solution state obtained as described above was then dropped onto the surface of the uneven structure to replace the residual liquid of 2-propanol with the sublimable film formation composition (step (I)).

Subsequently, the substrate for evaluation was rotated by a spin coater at a rotation speed of 100 revolutions per minute and the formation of a sublimable film (coagulated film of the sublimable substance) was visually confirmed (step (II)).

Subsequently, the rotation was continued until the disappearance of the sublimable film was visually confirmed (step (III)).

The steps (I) to (III) described above were performed under a nitrogen atmosphere of 23° C. to 24° C. and 1 atm.

Thereafter, the substrate for evaluation obtained after step (III) was observed using a scanning electron microscope (SEM) (SU8010, manufactured by Hitachi High-Technologies Corporation) and the ratio (pattern collapse rate) of convex portion collapse (pattern collapse) in the uneven structure was evaluated.

The "pattern collapse rate" was calculated by taking an electron microscope image (secondary electron image) of the center section of the substrate for evaluation using an SEM at a magnification with 500 to 600 convex portions in the field of view, counting the number of convex portions in the obtained image that collapsed, and calculating the ratio of the convex portions in the field of view as a percentage. The numerical values were rounded according to JIS Z 8401 with a rounding width of 10 by so-called rounding off.

The SEM images obtained in Example 1, Example 3, Example 5, Example 21, Example 22, and Comparative Example 1 are shown in FIGS. 2 to 7 respectively. In the results, in Comparative Example 1 and Example 1, planar collapse occurred, in Example 3 and Example 5, planar collapse did not occur but striated collapse occurred to some extent, and in Example 21 and Example 22, the occurrence of striated collapse was also small.

In Tables 3-1 and 3-2, the boiling point of isoborneol is the sublimation point. In the table, 1233Z is an abbreviation for cis-1-chloro-3,3,3-trifluoropropene, Novec (registered trademark) 7100 is synonymous with Novec 7100, and N71 is an abbreviation for Novec (registered trademark) 7100.

TABLE 1-1

| | Solvent boiling point [° C.] | Sublimating agent boiling point [° C.] | Boiling point difference (sublimating agent − solvent) [° C.] | Sublimating agent concentration [% by mass] | Coagulation time [seconds] |
|---|---|---|---|---|---|
| Example 1 | 61 | 204 | 143 | 1 | 10 |
| Example 2 | 65 | 204 | 139 | 1 | 170 |
| Example 3 | 65 | 204 | 139 | 3 | 200 |
| Example 4 | 39 | 204 | 165 | 2 | 10 |
| Example 5 | 49 | 204 | 155 | 1 | 10 |
| Example 6 | 57 | 204 | 147 | 1 | 70 |
| Example 7 | 77 | 204 | 127 | 1 | 120 |
| Example 8 | 82 | 204 | 122 | 1 | 440 |
| Example 9 | 39 | 164 | 125 | 1 | 30 |
| Example 10 | 57 | 164 | 107 | 1 | 50 |
| Example 11 | 39 | 114 | 75 | 30 | 10 |
| Example 12 | 39 | 114 | 75 | 20 | 10 |
| Example 13 | 39 | 114 | 75 | 10 | 10 |
| Example 14 | 39 | 114 | 75 | 5 | 10 |
| Example 15 | 39 | 114 | 75 | 3 | 10 |
| Example 16 | 61 | 114 | 53 | 10 | 10 |
| Example 17 | 63 | 195 | 132 | 4 | 30 |
| Example 18 | 49 | 195 | 146 | 4 | 30 |
| Example 19 | 81 | 195 | 114 | 4 | 70 |
| Example 20 | 39 | 195 | 156 | 4 | 10 |
| Example 21 | 68 | 195 | 127 | 4 | 20 |
| Example 22 | 101 | 195 | 94 | 4 | 200 |
| Example 23 | 98 | 195 | 97 | 4 | 120 |
| Example 24 | 98 | 195 | 97 | 8 | 80 |
| Example 25 | 98 | 195 | 97 | 12 | 70 |
| Comparative Example 1 | 65 | 195 | 130 | 4 | 90 |
| Example 26 | 39 | 115 | 76 | 10 | 10 |
| Example 27 | 65 | 114 | 49 | 10 | 150 |
| Example 28 | 65 | 114 | 49 | 20 | 300 |
| Example 29 | 82 | 114 | 32 | 20 | 260 |
| Example 30 | 82 | 114 | 32 | 60 | 40 |
| Example 31 | 39 | 260 | 221 | 1 | 70 |

TABLE 1-2

| | Pattern collapse rate [%] | Solvent | Sublimating agent | Saturation solubility [% by mass] |
|---|---|---|---|---|
| Example 1 | 30 (planar collapse) | Novec 7100 (N71) | (±)-Camphor | 15 |
| Example 2 | 70 | Methanol | (±)-Camphor | 68 |
| Example 3 | 30 (some striae) | Methanol | (±)-Camphor | 68 |
| Example 4 | 10 (some striae) | 1233Z | (±)-Camphor | 66 |
| Example 5 | 10 (some striae) | Cyclopentane | (±)-Camphor | 68 |
| Example 6 | 10 (few striae) | Methyl acetate | (±)-Camphor | 76 |
| Example 7 | 10 (some striae) | Ethyl acetate | (±)-Camphor | 68 |
| Example 8 | 10 (some striae) | IPA | (±)-Camphor | 62 |
| Example 9 | 30 (planar collapse) | 1233Z | Dimethyl oxalate | 42 |
| Example 10 | 30 (planar collapse) | Methyl acetate | Dimethyl oxalate | 19 |
| Example 11 | 10 (few striae) | 1233Z | Neopentyl alcohol | 78 |
| Example 12 | 10 (few striae) | 1233Z | Neopentyl alcohol | 78 |
| Example 13 | 10 (few striae) | 1233Z | Neopentyl alcohol | 78 |
| Example 14 | 10 (few striae) | 1233Z | Neopentyl alcohol | 78 |
| Example 15 | 10 (few striae) | 1233Z | Neopentyl alcohol | 78 |
| Example 16 | 10 (planar collapse) | Novec 7100 (N71) | Neopentyl alcohol | 47 |
| Example 17 | 10 (few striae) | 3-methylpentane | endo-tetrahydrodicyclopentadiene | 86 |
| Example 18 | 10 (few striae) | Cyclopentane | endo-tetrahydrodicyclopentadiene | 90 |
| Example 19 | 10 (few striae) | Cyclohexane | endo-tetrahydrodicyclopentadiene | 90 |
| Example 20 | 10 (some striae) | 1233Z | endo-tetrahydrodicyclopentadiene | 69 |
| Example 21 | 10 (few striae) | Hexane | endo-tetrahydrodicyclopentadiene | 88 |
| Example 22 | 10 (few striae) | Methylcyclohexane | endo-tetrahydrodicyclopentadiene | 82 |
| Example 23 | 10 (few striae) | Heptane | endo-tetrahydrodicyclopentadiene | 86 |
| Example 24 | 10 (few striae) | Heptane | endo-tetrahydrodicyclopentadiene | 86 |
| Example 25 | 10 (few striae) | Heptane | endo-tetrahydrodicyclopentadiene | 86 |
| Comparative Example 1 | 90 (planar collapse) | Methanol | endo-tetrahydrodicyclopentadiene | 8 |
| Example 26 | 80 (planar collapse) | 1233Z | pyrazine | 42 |
| Example 27 | 10 (few striae) | Methanol | Neopentyl alcohol | 95 |
| Example 28 | 10 (few striae) | Methanol | Neopentyl alcohol | 95 |

TABLE 1-2-continued

| | Pattern collapse rate [%] | Solvent | Sublimating agent | Saturation solubility [% by mass] |
|---|---|---|---|---|
| Example 29 | 10 (few striae) | 2-propanol | Neopentyl alcohol | 90 |
| Example 30 | 10 (few striae) | 2-propanol | Neopentyl alcohol | 90 |
| Example 31 | 30 (some striae) | 1233Z | Ethylene carbonate | 68 |

TABLE 2-1

| | Sublimating agent | | Solvent 1 | | Solvent 2 | |
|---|---|---|---|---|---|---|
| | Name | Boiling point [° C.] | Name | Boiling point [° C.] | Name | Boiling point [° C.] |
| Example 32 | (±)-Camphor | 204 | Acetone | 56 | cis-1-chloro-3,3,3-trifluoropropene | 39 |
| Example 33 | (±)-Camphor | 204 | Methyl acetate | 57 | cis-1-chloro-3,3,3-trifluoropropene | 39 |
| Example 34 | (±)-Camphor | 204 | Methyl acetate | 57 | cis-1-chloro-3,3,3-trifluoropropene | 39 |
| Example 35 | (±)-Camphor | 204 | Methyl acetate | 57 | cis-1-chloro-3,3,3-trifluoropropene | 39 |
| Example 36 | (±)-Camphor | 204 | 2-propanol | 82 | cis-1-chloro-3,3,3-trifluoropropene | 39 |
| Example 37 | (±)-Camphor | 204 | 4-methyl-2-pentanol | 132 | cis-1-chloro-3,3,3-trifluoropropene | 39 |
| Example 38 | (±)-Camphor | 204 | γ-butyrolactone | 204 | Novec 7100 | 61 |
| Comparative Example 2 | (±)-Camphor | 204 | γ-butyrolactone | 204 | (none) | |
| Example 39 | Neopentyl alcohol | 114 | Toluene | 111 | Novec 7100 | 61 |
| Comparative Example 3 | Neopentyl alcohol | 114 | Toluene | 111 | (none) | |
| Example 40 | Tetrahydrodicyclopentadiene | 195 | Hexane | 68 | cis-1-chloro-3,3,3-trifluoropropene | 39 |
| Example 41 | Tetrahydrodicyclopentadiene | 195 | Heptane | 98 | cis-1-chloro-3,3,3-trifluoropropene | 39 |
| Example 42 | Tetrahydrodicyclopentadiene | 195 | Methylcyclohexane | 101 | cis-1-chloro-3,3,3-trifluoropropene | 39 |
| Example 43 | Tetrahydrodicyclopentadiene | 195 | Methylcyclohexane | 101 | cis-1-chloro-3,3,3-trifluorppppppene | 39 |
| Example 44 | Tetrahydrodicyclopentadiene | 195 | Decane | 174 | cis-1-chloro-3,3,3-trifluoropropene | 39 |
| Example 45 | Tetrahydrodicyclopentadiene | 195 | Methylcyclohexane | 101 | Hexane | 68 |
| Example 46 | (±)-Camphor | 204 | 2-propanol | 82 | cis-1-chloro-3,3,3-trifluoropropene | 39 |
| Example 47 | (±)-Camphor | 204 | 4-methyl-2-pentanol | 132 | cis-1-chloro-3,3,3-trifluoropropene | 39 |
| Example 48 | (±)-Camphor | 204 | 4-methyl-2-pentanol | 132 | cis-1-chloro-3,3,3-trifluoropropene | 39 |
| Example 49 | Neopentyl alcohol | 114 | Methanol | 65 | cis-1-chloro-3,3,3-trifluoropropene | 39 |
| Example 50 | Neopentyl alcohol | 114 | 2-propanol | 82 | cis-1-chloro-3,3,3-trifluoropropene | 39 |
| Example 51 | Neopentyl alcohol | 114 | 2-propanol | 82 | cis-1-chloro-3,3,3-trifluoropropene | 39 |
| Example 52 | Neopentyl alcohol | 114 | 2-propanol | 82 | cis-1-chloro-3,3,3-trifluoropropene | 39 |
| Example 53 | Neopentyl alcohol | 114 | Methyl acetate | 57 | cis-1-chloro-3,3,3-trifluoropropene | 39 |
| Example 54 | Neopentyl alcohol | 114 | Tetrahydrofuran | 66 | cis-1-chloro-3,3,3-trifluoropropene | 39 |
| Example 55 | Neopentyl alcohol | 114 | 2-propanol | 82 | cis-1-chloro-3,3,3-trifluoropropene | 39 |
| Example 56 | Neopentyl alcohol | 114 | 2-propanol | 82 | cis-1-chloro-3,3,3-trifluoropropene | 39 |
| Example 57 | Neopentyl alcohol | 114 | Cyclohexane | 81 | cis-1-chloro-3,3,3-triflupropropene | 39 |
| Example 58 | Neopentyl alcohol | 114 | 2-propanol | 82 | Methanol | 65 |
| Example 59 | Neopentyl alcohol | 114 | 2-methyl-2-butanol | 103 | Methanol | 65 |
| Example 60 | Neopentyl alcohol | 114 | 2-methyl-2-butanol | 103 | 2-propanol | 82 |
| Example 61 | Neopentyl alcohol | 114 | 2-methyl-2-butanol | 103 | cis-1-chloro-3,3,3-trifluoropropene | 39 |
| Example 62 | Neopentyl alcohol | 114 | 2-methyl-2-butanol | 103 | cis-1-chloro-3,3,3-trifluoropropene | 39 |

TABLE 2-1-continued

| | Sublimating agent | | Solvent 1 | | Solvent 2 | |
| | Name | Boiling point [° C.] | Name | Boiling point [° C.] | Name | Boiling point [° C.] |
| --- | --- | --- | --- | --- | --- | --- |
| Example 63 | Neopentyl alcohol | 114 | 2-methyl-2-butanol | 103 | cis-1-chloro-3,3,3-trifluoropropene | 39 |
| Example 64 | Neopentyl alcohol | 114 | 2-propanol | 82 | cis-1-chloro-3,3,3-trifluoropropene | 39 |

TABLE 2-2

| | Solvent 3 | | Mixing ratio | | | | | |
| | Name | Boiling point [° C.] | Sublimating agent [% by mass] | Solvent 1 [% by mass] | Solvent 2 [% by mass] | Solvent 3 [% by mass] | Coagulation time [seconds] | Pattern collapse rate [%] |
| --- | --- | --- | --- | --- | --- | --- | --- | --- |
| Example 32 | (none) | | 1 | 1 | 98 | (none) | 10 | 10 (some striae) |
| Example 33 | | | 1 | 1 | 98 | | 10 | 10 (few striae) |
| Example 34 | | | 0.5 | 5 | 94.5 | | 10 | 10 (few striae) |
| Example 35 | | | 0.3 | 1 | 98.7 | | 10 | 10 (few striae) |
| Example36 | | | 1 | 30 | 69 | | 130 | 10 (sone striae) |
| Example 37 | | | 1 | 1 | 98 | | 110 | 10 (some striae) |
| Example 36 | | | 3 | 1 | 96 | | 10 | 10 (few striae) |
| Comparative Example 2 | | | 3 | 97 | (none) | | (no precipitation) | 100 |
| Example 39 | | | 10 | 1 | 89 | | 10 | 10 (few striae) |
| Comparative Example 3 | | | 50 | 50 | (none) | | (no precipitation) | 100 |
| Example 40 | | | 4 | 4 | 92 | | 10 | 10 (few striae) |
| Example 41 | | | 4 | 4 | 92 | | 20 | 10 (few striae) |
| Example 42 | | | 1 | 4 | 95 | | 20 | 10 (few striae) |
| Example 43 | | | 4 | 8 | 88 | | 80 | 10 (few striae) |
| Example 44 | | | 6 | 1 | 93 | | 110 | 10 (few striae) |
| Example 45 | | | 4 | 4 | 92 | | 80 | 10 (few striae) |
| Example 46 | Methyl acetate | 37 | 1 | 0.1 | 97.9 | 1 | 10 | 10 (some striae) |
| Example 47 | Methyl acetate | 57 | 1 | 0.1 | 97.9 | 1 | 10 | 10 (some striae) |
| Example 46 | 2-propanol | 82 | 1 | 0.1 | 97.9 | 1 | 10 | 10 (some striae) |
| Example 49 | (none) | | 5 | 1 | 94 | (none) | 10 | 10 (few striae) |
| Example 50 | | | 5 | 2 | 93 | | 10 | 10 (few striae) |
| Example 51 | | | 5 | 10 | 85 | | 50 | 10 (few striae) |
| Example 52 | | | 15 | 10 | 75 | | 210 | 10 (few striae) |
| Example 53 | | | 5 | 10 | 85 | | 10 | 10 (few striae) |
| Example 54 | | | 5 | 10 | 85 | | 20 | 10 (few striae) |
| Example 55 | | | 30 | 10 | 60 | | 50 | 10 (few striae) |
| Example 56 | | | 30 | 20 | 50 | | 40 | 10 (few striae) |
| Example 57 | | | 5 | 1 | 94 | | 10 | 10 (some striae) |
| Example 58 | | | 10 | 5 | 85 | | 150 | 10 (few striae) |
| Example 59 | | | 10 | 2 | 88 | | 180 | 10 (few striae) |
| Example 60 | | | 15 | 1 | 84 | | 180 | 10 (few striae) |
| Example 61 | 2-propanol | 82 | 5 | 1 | 92 | 2 | 40 | 10 (few striae) |
| Example 62 | 2-propanol | 82 | 15 | 1 | 74 | 10 | 130 | 10 (few striae) |
| Example 63 | 2-propanol | 82 | 25 | 5 | 60 | 10 | 480 | 10 (few striae) |
| Example 64 | 1-propanol | 97 | 5 | 2 | 92 | 1 | 40 | 10 (few striae) |

TABLE 3-1

| | Sublimating agent 1 | | Sublimating agent 2 | | Solvent 1 | | Solvent 2 | |
| | Name | Boiling point [° C.] | Name | Boiling point [° C.] | Name | Boiling point [° C.] | Name | Boiling point [° C.] |
| --- | --- | --- | --- | --- | --- | --- | --- | --- |
| Example 65 | (±)-Camphor | 204 | (+)-Camphor | 204 | Methyl acetate | 57 | 1233Z | 39 |
| Example 66 | (±)-Camphor | 204 | (+)-Camphor | 204 | Methyl acetate | 57 | 1233Z | 39 |

TABLE 3-1-continued

| | Sublimating agent 1 | | Sublimating agent 2 | | Solvent 1 | | Solvent 2 | |
|---|---|---|---|---|---|---|---|---|
| | Name | Boiling point [° C.] | Name | Boiling point [° C.] | Name | Boiling point [° C.] | Name | Boiling point [° C.] |
| Example 67 | (±)-Camphor | 204 | (+)-Camphor | 204 | Methyl acetate | 57 | 1233Z | 39 |
| Example 68 | (±)-Camphor | 204 | (+)-Camphor | 204 | Methyl acetate | 57 | 1233Z | 39 |
| Example 69 | (±)-Camphor | 204 | (+)-Camphor | 204 | Methyl acetate | 57 | 1233Z | 39 |
| Example 70 | (±)-Camphor | 204 | (+)-Camphor | 204 | Methyl acetate | 57 | 1233Z | 39 |
| Example 71 | (±)-Camphor | 204 | (±)-Isoborneol | 214 | Methyl acetate | 57 | 1233Z | 39 |
| Example 72 | (±)-Camphor | 204 | (±)-Isoborneol | 214 | Methyl acetate | 57 | 1233Z | 39 |
| Example 73 | (±)-Camphor | 204 | (±)-Isoborneol | 214 | Methyl acetate | 57 | 1233Z | 39 |
| Example 74 | (±)-Camphor | 204 | (±)-Isoborneol | 214 | Methyl acetate | 57 | 1233Z | 39 |
| Example 75 | (±)-Camphor | 204 | (±)-Isoborneol | 214 | Methyl acetate | 57 | 1233Z | 39 |

TABLE 3-2

| | Mixing ratio | | | | |
|---|---|---|---|---|---|
| | Sublimating agent 1 [% by mass] | Sublimating agent 2 [% by mass] | Solvent 1 [% by mass] | Solvent 2 [% by mass] | Pattern collapse rate [%] |
| Example 65 | 1 | 0 | 1 | 98 | 10 (few striae) |
| Example 66 | 0.7 | 0.3 | 1 | 98 | 10 (few striae) |
| Example 67 | 0.5 | 0.5 | 1 | 98 | 10 (few striae) |
| Example 68 | 0.2 | 0.8 | 1 | 98 | 10 (few striae) |
| Example 69 | 0.02 | 0.98 | 1 | 98 | 10 (few striae) |
| Example 70 | 0 | 1 | 1 | 98 | 10 (few striae) |
| Example 71 | 1 | 0 | 1 | 98 | 10 (few striae) |
| Example 72 | 0.9 | 0.1 | 1 | 98 | 10 (few striae) |
| Example 73 | 0.8 | 0.2 | 1 | 98 | 10 (few striae) |
| Example 74 | 0.5 | 0.5 | 1 | 98 | 10 (few striae) |
| Example 75 | 0 | 1 | 1 | 98 | 10 (some striae) |

TABLE 4

| Sublimating agent | Solvent | Saturation solubility [% by mass] |
|---|---|---|
| Neopentyl alcohol | cis-1-chloro-3,3,3-trifluoropropene | 78 |
| | Novec 7100 | 47 |
| | Methanol | 95 |
| | 1-propanol | 92 |
| | 2-propanol | 90 |
| | 2-butanol | 87 |
| | 2-methyl-2-butanol | 81 |
| | 2-butanone | 88 |
| | 3-pentanone | 88 |
| | 4-methyl-2-pentanone | 87 |
| | Cyclohexane | 40 |
| | Tetrahydrofuran | 87 |
| | Methyl acetate | 89 |
| | Toluene | 83 |
| Camphor | cis-1-chloro-3,3,3-trifluoropropene | 66 |
| | Cyclopentane | 68 |
| | Methyl acetate | 76 |
| | Novec 7100 | 15 |
| | Ethyl acetate | 68 |
| | Methanol | 68 |
| | 2-propanol | 62 |
| | 4-methyl-2-pentanol | 56 |

TABLE 4-continued

| Sublimating agent | Solvent | Saturation solubility [% by mass] |
|---|---|---|
| | Propylene glycol monomethyl ether acetate | 57 |
| | Acetone | 71 |
| | γ-butyrolactone | 55 |
| Pyrazine | cis-1-chloro-3,3,3-trifluoropropene | 42 |
| | Methanol | 74 |
| Tetrahydrodicyclo pentadiene | 3-methylpentane | 86 |
| | Cyclopentane | 90 |
| | Cyclohexane | 81 |
| | cis-1-chloro-3,3,3-trifluoropropene | 69 |
| | Hexane | 88 |
| | Methyl acetate | 86 |
| | Methanol | 8 |
| | Ethanol | 24 |
| | Methylcyclohexane | 82 |
| | Heptane | 86 |
| | Decane | 80 |
| Dimethyl oxalate | Methyl acetate | 19 |
| | cis-1-chloro-3,3,3-trifluoropropene | 42 |

27

TABLE 4-continued

| Sublimating agent | Solvent | Saturation solubility [% by mass] |
|---|---|---|
| Napthalene | 2-propanol | 10 |
| Isoborneol | Methyl acetate | 55 |
| | cis-1-chloro-3,3,3-trifluoropropene | 21 |
| Ethylene carbonate | cis-1-chloro-3,3,3-trifluoropropene | 71 |

TABLE 5

| Sublimating agent | Coagulation heat [J/g] | Coagulation point [° C.] |
|---|---|---|
| Neopentyl alcohol | 22 | 54 |
| Camphor | 38 | 179 |
| Pyrazine | 191 | 47 |
| Tetrahydrodicyclopentadiene | 13 | 74 |
| Dimethyl oxalate | 192 | 54 |
| Napthalene | 160 | 80 |
| Isoborneol | 31 | 214 (sublimation point) |
| Ethylene carbonate | 94 | 37 |

In the results, the sublimable film formation compositions of Examples 1 to 31 suppressed the pattern collapse rate compared to Comparative Example 1 and the sublimable film formation compositions of Examples 32 to 75 suppressed the pattern collapse rate compared to Comparative Examples 2 and 3. Among the Examples, results where the occurrence of striated collapse was suppressed were seen.

It is possible to suitably use the sublimable film formation compositions of Examples 1 to 75 in the production process of substrates having an uneven structure and to increase the production stability of the substrates.

This application claims priority based on Japanese Patent Application No. 2020-046815 filed on Mar. 17, 2020, the entire disclosure of which is hereby incorporated herein.

REFERENCE SIGNS LIST

10: substrate
20: uneven structure
22: convex portion
24: recessed portion
30: sublimable film formation composition
50: sublimable film

The invention claimed is:

1. A sublimable film formation composition comprising:
a sublimable substance; and
a solvent A1 in which a saturation solubility of the sublimable substance is 76% by mass or more and a boiling point is lower by 5° C. or more than a boiling point of the sublimable substance at 1 atm.

2. The sublimable film formation composition according to claim 1, further comprising:
a solvent B1 in which a boiling point is less than the boiling point of the solvent A1.

3. The sublimable film formation composition according to claim 1,
wherein a content of the solvent A1 in the sublimable film formation composition is 50% by mass or more.

4. The sublimable film formation composition according to claim 1,
wherein a coagulation heat of the sublimable substance is 200 J/g or less.

5. The sublimable film formation composition according to claim 1,
wherein a coagulation point of the sublimable substance at 1 atm is 5° C. or higher.

6. The sublimable film formation composition according to claim 1,
wherein the boiling point of the sublimable substance at 1 atm is 300° C. or lower.

7. The sublimable film formation composition according to claim 1,
wherein a content of the sublimable substance is 80% by mass or less in the sublimable film formation composition.

8. The sublimable film formation composition according to claim 1, wherein the sublimable substance is at least one selected from the group consisting of norbornene, norbornane, camphor, pyrazine, 2,3-dichloropyrazine, 2, 6-dichloropyrazine, 2,6-dichloropyridine, tetrahydrodicyclopentadiene, dimethyl oxalate, isoborneol, neopentyl alcohol, neopentyl glycol, and ethylene carbonate.

9. A method for producing a substrate, the method comprising:
a step of preparing a substrate having an uneven structure on a surface;
a step of supplying a sublimable film formation composition including a sublimable substance to the surface,
a step of causing the sublimable film formation composition to coagulate and forming a sublimable film on the surface; and
a step of removing the sublimable film by sublimating the sublimable substance,
wherein the sublimable film formation composition including the sublimable substance is the sublimable film formation composition according to claim 1.

10. The method for producing a substrate according to claim 9,
wherein the substrate has the uneven structure with a pattern dimension of 30 nm or less on the surface.

11. The method for producing a substrate according to claim 10,
wherein the substrate has the uneven structure with the pattern dimension of 20 nm or less on the surface.

* * * * *